(12) United States Patent
Kost

(10) Patent No.: US 7,362,254 B2
(45) Date of Patent: Apr. 22, 2008

(54) SYSTEMS AND METHODS FOR MINIMIZING DELAY IN A CONTROL PATH

(75) Inventor: Michael A. Kost, Cedar Park, TX (US)

(73) Assignee: D2Audio Corporation, Austin, TX (US)

( * ) Notice: Subject to any disclaimer, the term of this patent is extended or adjusted under 35 U.S.C. 154(b) by 0 days.

(21) Appl. No.: 11/669,305

(22) Filed: Jan. 31, 2007

(65) Prior Publication Data

US 2007/0176815 A1    Aug. 2, 2007

Related U.S. Application Data

(60) Provisional application No. 60/763,613, filed on Jan. 31, 2006.

(51) Int. Cl.
*H03M 1/12* (2006.01)
(52) U.S. Cl. .................. 341/155; 341/100; 341/118; 341/144; 330/10; 330/207 A; 330/251
(58) Field of Classification Search ............... 341/100, 341/118, 143–144, 152, 155; 330/10, 207 A, 330/251
See application file for complete search history.

(56) References Cited

U.S. PATENT DOCUMENTS 6,107,876 A * 8/2000 O'Brien ..................... 330/10

| | | | | |
|---|---|---|---|---|
| 6,344,811 B1 * | 2/2002 | Melanson | ................... | 341/143 |
| 6,373,334 B1 * | 4/2002 | Melanson | ................... | 330/10 |
| 6,759,899 B2 * | 7/2004 | Lennartson et al. | .......... | 330/10 |
| 6,765,436 B1 * | 7/2004 | Melanson et al. | ............ | 330/10 |
| 7,286,009 B2 * | 10/2007 | Andersen et al. | ............. | 330/10 |

* cited by examiner

*Primary Examiner*—Khai M Nguyen
(74) *Attorney, Agent, or Firm*—Law Offices of Mark L. Berrier

(57) ABSTRACT

Systems and methods for minimizing delay in a feedback path. In one embodiment, an analog-to-digital feedback path includes an analog-to-digital converter (ADC) configured to receive and digitize an analog signal such as an amplifier output to produce a serial digital output. A serial interface receives and parallelizes the serial digital output to produce a parallel data words that are provided to a processing unit such as a decimator. The processing unit processes the data words to produce a digital feedback signal which can then be used to modify an input signal, such as a digital audio input to the amplifier. A delay minimization subsystem is implemented in the feedback path to monitor a delay between generation of parallel data words by the serial interface and consumption of the parallel data words by the first processing unit. The delay minimization mechanism may be implemented in multiple channels of the feedback path.

20 Claims, 6 Drawing Sheets

SYSTEMS AND METHODS FOR MINIMIZING DELAY IN A CONTROL PATH

RELATED APPLICATIONS

This application claims the benefit of U.S. Provisional Patent Application 60/763,613, filed Jan. 31, 2006, which is incorporated by reference as if set forth herein in its entirety.

BACKGROUND

1. Field of the Invention

The invention relates generally to audio amplification systems, and more particularly to systems and methods for minimizing feedback delay in closed-loop amplification systems utilizing analog to digital converters (ADC) as part of the feedback loop.

2. Related Art

Practical audio power amplifiers using Pulse Width Modulation (PWM) have been known since the mid 1960s. In amplifiers from that era, a pulse train was generated by comparing a voltage representing the incoming audio signal with a reference waveform, typically a triangular wave or sawtooth wave, with a frequency in the range 50 kHz-200 kHz. The comparison yielded a 2-level rectangular wave having the same frequency as the reference waveform, and with a mark:space ratio varying in sympathy with the audio. The rectangular wave was amplified to the desired power level and then passively lowpass filtered to remove most of the high-frequency components of the rectangular wave, leaving its average level, which follows the audio, to drive a load such as a loudspeaker.

It is possible to obtain extremely good performance when such amplifiers are run 'open-loop', that is without feedback, but it is an expensive solution, since the amplifier's performance is critically dependent on the quality of the output stages and the power supply. To alleviate these dependencies, the trend in the 1970's, and subsequently, has been to incorporate feedback. One simple way to incorporate feedback in an amplifier that compares the audio with a triangle wave is to replace a fixed triangle wave by a sawtooth wave that is obtained by integrating the substantially rectangular waveform. Analysis shows that this is an effective means of providing feedback. Moreover since the feedback is tightly integrated into the pulse width modulation itself, stability problems typically associated with feedback do not arise.

Amplifiers as described above have sometimes been called 'digital' in the popular press, but we shall describe them as 'analog', because the timings of the edges of the rectangular waves can vary continuously in sympathy with the audio. We shall reserve the word 'digital' for an amplifier in which the edge timings are quantized, so that the edge timings can be represented digitally and the edges can be generated by counting pulses produced by a high-precision, high-frequency clock, such as a crystal oscillator. This principle was proposed by Sandier (Sandier, M., "Towards a Digital Power Amplifier" Audio Eng. Soc Preprint Number: 2135, September 1984,) who also realized that the apparent need for a clock frequency in the gigahertz region could be avoided by the use of oversampling and noise shaping. Several commercial products are now available that use this principle (see, for example, Harris, S., Andersen, J., and Chieng, D., "Intelligent Class D Amplifier Controller Integrated Circuit as an Ingredient Technology for Multi-Channel Amplifier Modules of Greater than 50 Watts/Channel" Presented at the AES 115th Convention 2003 Oct. 10-13 New York, Audio Eng. Soc. preprint #5947.)

The digital principle brings precision to the generation of the PWM waveform, but the power amplification, typically accomplished by MOSFET (Metal Oxide Silicon Field Effect Transistors) power switches, remains a fundamentally analog process, and as such is vulnerable to non-ideal component behavior. There is a distortion associated with the switching called "dead-time distortion", and there is dependency on the power supply, just as with the original analog PWM amplifiers. Without feedback or other compensation, the gain of the output stage will be directly proportional to the supply voltage. This precludes the use of an inexpensive non-regulated power supply in low-cost applications, or condemns the system to relatively poor performance.

Andersen et al., in U.S. patent application Ser. No. 11/324,132 now U.S. Pat. No. 7,286,009 ("Andersen et al."), illustrated how to construct a digital PWM amplifier utilizing feedback techniques to improve performance. The described system uses analog-to-digital converters (ADCs) to sample and digitize the amplifier's analog output and/or the power supply for use in the feedback signal processing. This amplifier system utilized a PWM controller and independent ADCs for sampling the analog output and power supply. The system compensated for the signal-processing delay associated with elements of the analog to digital conversion like low-pass and anti-aliasing filters, but did not address the delay incurred transporting the digitized samples from the ADO into the PWM controller.

Modern ADCs utilize a serial interface to transport the digital samples to other devices. $I^2S$ is a commonly used standard for the serialization of ADC samples. For each sampling period, the ADO creates a multi-bit sample of 4 to 24 bits, depending on specific implementation. This multi-bit sample is then serialized and transmitted using multiple bit-clocks, typically one bit-clock per sample bit.

The receiver typically buffers incoming serialized bits and, upon receiving a full sample, de-serializes the sample for later use. The steps of serializing, communication, and de-serializing the ADC samples in a digital PWM amplifier utilizing feedback techniques incurs delay that reduces the performance of the amplifier. It is therefore beneficial to reduce the delay introduced in the sampling and communication process.

SUMMARY OF THE INVENTION

One or more of the problems outlined above may be solved by the various embodiments of the invention. Broadly speaking, the invention comprises systems and methods for minimizing the communication and transport delay for ADCs that are part of a digital PWM amplifier feedback loop.

One embodiment of the invention is implemented in a digital Class D pulse width modulated (PWM) amplifier utilizing feedback. In this embodiment, the amplified output is sampled by an analog to digital converter (ADC) before the passive inductor-capacitor filter. The amplified output is filtered by a low-pass filter before being presented to the ADC. The ADC digital output is transported by a serial interface to be further signal processed by a decimation filter. The ADC Master Clock (MCLK) is generated by the PWM controller to guarantee that the ADC creates new samples at the rate the decimation filter uses samples. A Phase Detect block measures the time delay between the ADC sample being received by the serial interface and the sample being consumed by the decimation filter. The generated MCLK is then manipulated to decrease the delay by extending one phase of a clock cycle.

One embodiment is an analog-to-digital feedback path, such as may be used in a PWM amplifier. The feedback path includes an analog-to-digital converter (ADC) configured to receive and digitize an analog signal, such as the output of the power switches in an amplifier, to produce a serial digital output. A serial interface receives and parallelizes the serial digital output to produce a parallel data words. The data words are then provided to a processing unit such as a decimator, which processes the parallel data words to produce a digital feedback signal. This feedback signal can then be used to modify an input signal, such as a digital audio input to an amplifier. A delay minimization subsystem is implemented in the feedback path to monitor a delay between generation of parallel data words by the serial interface and consumption of the parallel data words by the first processing unit, and to minimize this delay.

In one embodiment, the delay minimization subsystem includes a delay measurement unit which monitors the delay, and a clock generator which generates a clock signal which is provided to the ADC and the serial interface, where the clock generator is configured to adjust the clock signal to minimize the first delay. The clock generator may, for example, adjust the clock signal by stretching one or more periods of the clock signal, and may be selectable to stretch the clock signal on either a high phase or a low phase. The delay measurement unit and the clock generator may be monitored and controlled by a digital signal processor (DSP.) In one embodiment, the feedback path includes multiple feedback channels, where each of the feedback channels is configured as described above. The clock signals and corresponding delays in each of the feedback channels may be independently adjustable.

Another embodiment comprises a method for generating digital feedback from an analog signal. The method includes digitizing the analog signal to produce a serial digital output, converting the serial digital output into parallel data words, providing the parallel data words to a processing unit which produces a digital feedback signal, monitoring the delay between generating and consuming the parallel data words and minimizing this delay. The method may further include generating a clock signal which is used in the digitizing of the analog signal and the converting of the serial digital output into parallel data words, and adjusting the clock signal to minimize the delay. Adjusting the clock signal may consist of stretching one or more periods of the clock signal, and this may be done on either a high phase or a low phase of the clock signal. In one embodiment, the method is implemented in multiple feedback channels of the feedback path, and the adjustment of the delays in the separate channels may be done independently of the other channels.

Numerous other embodiments and variations are also possible.

BRIEF DESCRIPTION OF THE DRAWINGS

Other objects and advantages of the invention may become apparent upon reading the following detailed description and upon reference to the accompanying drawings.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for minimizing the communication and transport delay for ADCs that are part of a digital PWM amplifier feedback loop. One embodiment is implemented in a Class D pulse width modulated (PWM) amplifier with feedback.

One embodiment of the invention is implemented in a digital Class D pulse width modulated (PWM) amplifier that utilizes feedback. In this embodiment, the amplified output of the amplifier's power switch is sampled by an analog to digital converter (ADC) before the passive inductor-capacitor filter that couples the output to a loudspeaker. The amplified output is filtered by a low-pass filter before being input to the ADC. The ADC's digital output is transported by a serial interface to a processing unit such as a decimation filter.

The ADC and serial interface operate based on a master clock signal (MCLK.) Although it is known that the ADC (and serial interface) will produce data words at the same rate the data words are used by the processing unit, the start-up phase of the ADC is unknown, so the delay between the serial interface presenting data words to the processing unit and the processing unit using these data words is not initially known. In one embodiment, this delay is measured by a phase detect block, and this information is provided to a DSP. The DSP then controls the MCLK generator to stretch one of the periods of the MCLK signal so that the delay is minimized. This same mechanism can be implemented in multiple channels of a feedback path.

Figure 1:
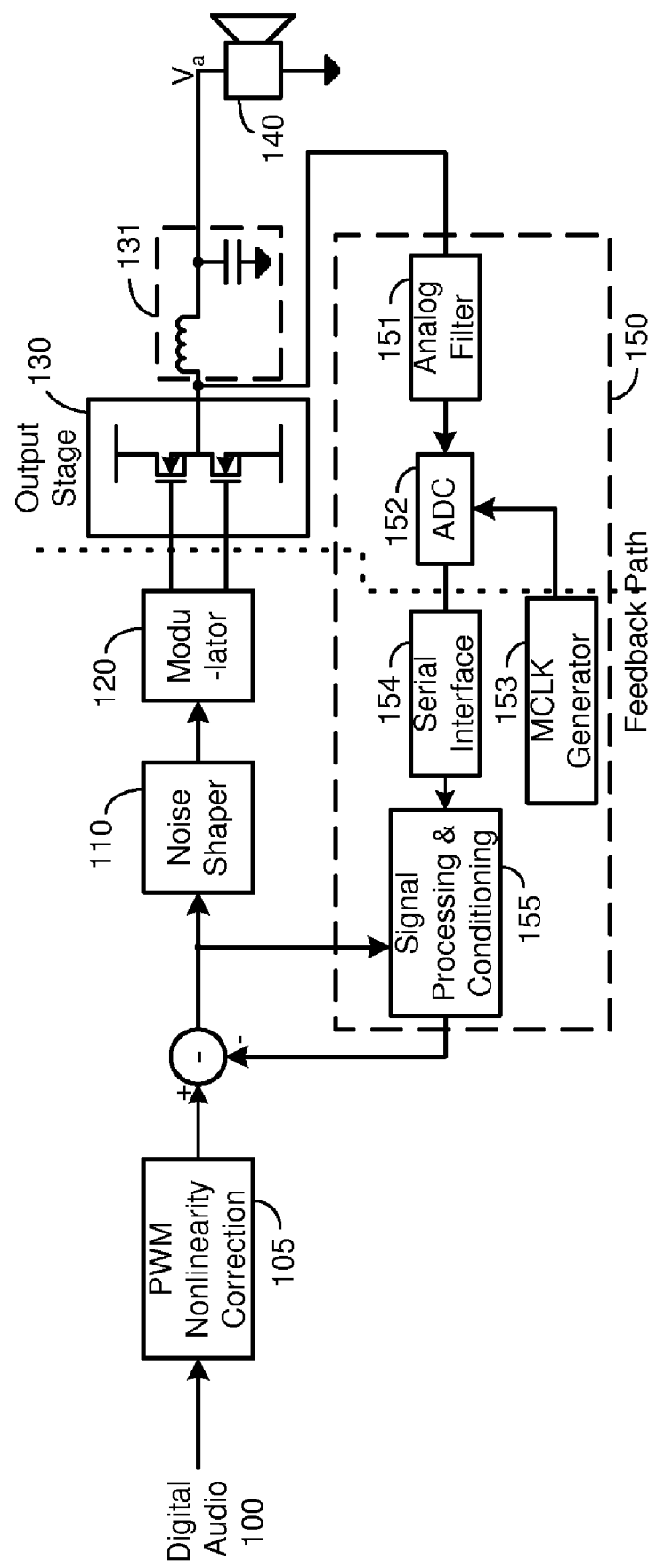
FIG. 1 is a functional block diagram illustrating a digital PWM amplification system utilizing feedback.

A typical digital PWM amplifier with feedback is shown in FIG. 1. As depicted in the figure, the PWM amplifier system comprises a digital audio signal (100), a PWM nonlinearity correction (105), a noise shaper (110), a modulator (120), an output stage (130), an LC low-pass filter (131), a load (140), and a feedback path (150). The feedback path consists of an analog filter (151), an ADC (152), MCLK generator block (153), a serial interface block (154), and a signal processing & conditioning block (155).

In normal operation, a digital audio signal (100) is provided to the amplifier. The digital audio signal (100) is typically in a 24-bit, pulse-code modulated (PCM) format and typically supplied at a 512 kHz sampling rate. A PWM nonlinearity correction block (105) applies a pre-correction to the digital audio signal that approximately corrects for the non-linear artifacts created by the PCM to PWM conversion. The pre-corrected digital audio is then summed with the feedback path (150) and then noise-shaped in the noise shaper (110). The noise shaper typically quantizes the 24-bit PCM digital audio sample to a 10-bit PCM digital audio sample and uses noise shaping techniques to reduce the quantization noise inside the audio band, typically DC to 20 or 40 kHz. The modulator block (120) performs the PCM to PWM conversion on the 10-bit digital audio. 2-level modulation is typically used, but other PWM modulation schemes, like 3-level (class BD) modulation may also be used. The output stage (130) amplifies the PWM waveforms generated by the modulator block (120), typically utilizing high voltage power supplies, high power field-effect transistors (FETs), and various other components. The output stage (130) output is filtered by the passive LC filter (131) to attenuate the PWM switching signal and is connected to the load (140), typically a loudspeaker.

In the feedback path (150), the output of the output stage (130) is filtered by an analog filter (151), typically a $3^{rd}$ order low-pass filter with a DC gain of 0.2 and 2 poles at 100 kHz and 1 pole at 500 kHz, and routed to the analog to digital converter (ADC) (152). The ADC (152) is typically a multi-bit delta-sigma audio converter and digitizes the analog filtered PWM output. The ADC (152) receives its Master clock (MCLK) from the MCLK generator (153). The MCLK rate is configured so that the ADC's delta-sigma output word rate matches the input word rate expected by the signal processing & conditioning block (155). A typical configuration will use an MCLK rate of 24.576 MHz. 4 MCLK clock cycles are used to produce a delta-sigma word, and thus a delta-sigma word rate of 6.144 MHz. Each delta-sigma word is typically 4 bits long and is serialized by the ADC (152) and transmitted by a serial bus to the serial interface (154), which deserializes the delta-sigma word and presents it to the signal processing and conditioning block (155). The signal processing and conditioning block (155) will typically decimate the incoming delta-sigma modulator word to the PWM sampling rate of 512 kHz, and then perform necessary signal processing to close and maintain the feedback loop as described in Andersen, et al.

As mentioned in Andersen, et al., the signal delay through the feedback path (150) is critical to the performance of the amplifier system. This delay can manifest itself by two mechanisms: phase delay due to filtering and signal processing, and computation and transport delay incurred moving digital information from one place to another. Andersen, et al. addressed techniques to compensate for various phase delays incurred in the digital and analog filtering required for feedback. The delay in transporting digital signals to various parts of the system is an unaddressed problem. Take, for example, the communication delay in transporting a delta-sigma modulator word from the ADC (152) through to the signal processing & conditioning block (155). This is of interest because the high performance ADCs required for feedback applications are typically implemented in stand-alone chips with two channels of analog to digital conversion per chip. These ADCs typically utilize a low cost serial interface that minimizes the number of pins required to communicate information. The use of serial interfaces results in possible delay added to the feedback path during the communication from the ADC to subsequent components in the feedback path.

Figure 2:
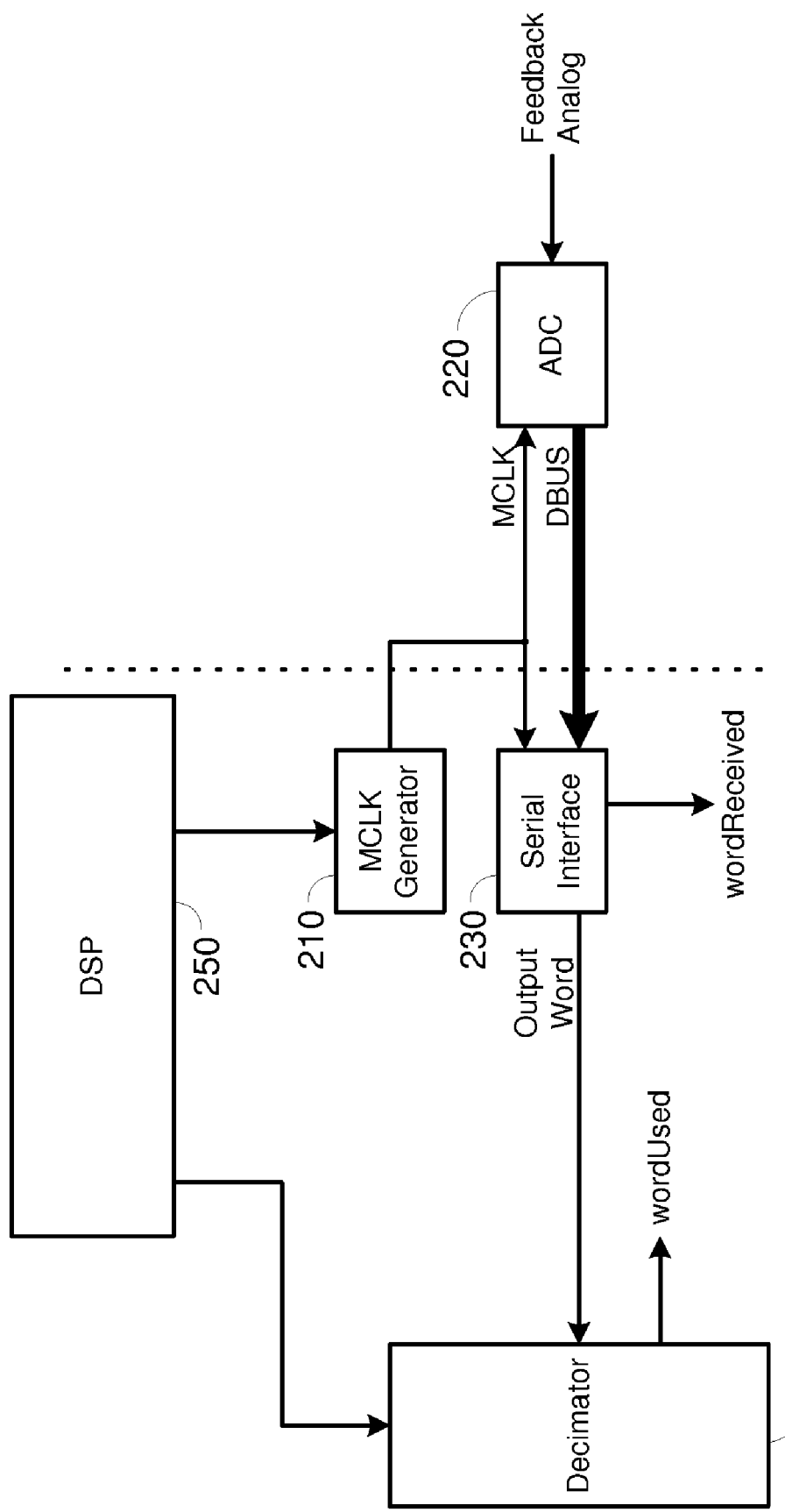
FIG. 2 is a functional block diagram illustrating the signal flow from an ADC to a decimator in a digital PWM amplification system utilizing feedback.

FIG. 2 highlights the communication path from the ADC to the decimator typically contained in the signal processing and conditioning block (155) found in FIG. 1. An MCLK generator (210) provides a MCLK to the ADC (220). The MCLK and serial communication signals, DBUS, are also provided to the serial interface (230). DBUS will be comprised of one data signal per channel of analog to digital conversion present on the ADC and a signal to provide a frame indicator that notes the beginning and end of a serialized delta-sigma word. MCLK is used as the bit-clock for the serial interface. Other protocols and signal configurations are possible for DBUS. The serial interface (230) deserializes the incoming 4-bit delta-sigma word and presents it to the decimator (240) for use. When the serial interface correctly captures and presents a delta-sigma word, it pulses the wordReceived signal to indicate that a new word has been received. When the decimator utilizes the incoming delta-sigma sample, it pulses the wordUsed signal to indicate that a word has been consumed. A digital signal processor (DSP) (250) is present in the system to provide configuration information to the decimator and MCLK generator.

Figure 3:
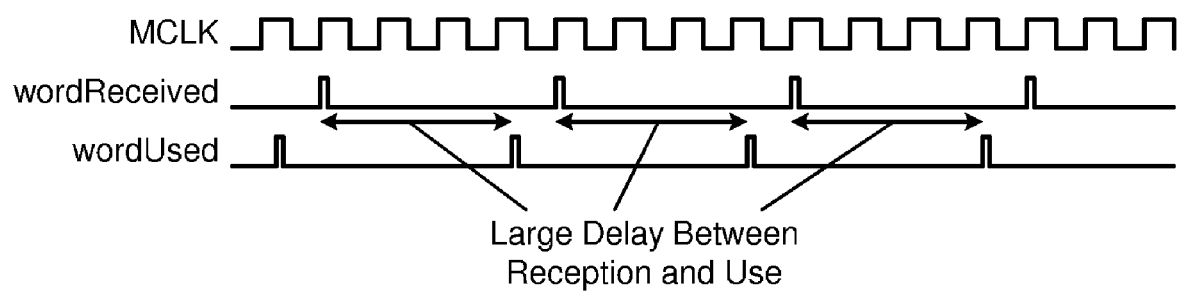
FIG. 3 is a timing diagram illustrating the inherent delay in serial communication.

FIG. 3 contains a timing diagram illustrating the delay that can occur due to the serialized data transport. The MCLK, wordReceived, and wordUsed signals refer to the signals in FIG. 2. This figure assumes that it takes 4 MCLK cycles to transmit a delta-sigma word from the ADC. The time delta between the wordReceived pulse and the following wordUsed pulse is delay which, as noted above, is detrimental to feedback systems. The worse-case delay scenario has the decimator consume a delta-sigma word just before another is received. This is indicated in the diagram by the wordUsed signal pulsing just before the wordReceived signal pulses as shown in FIG. 3. The preferred case is that the time delta between the wordReceived signal and the following wordUsed signal be minimized.

Figure 4:
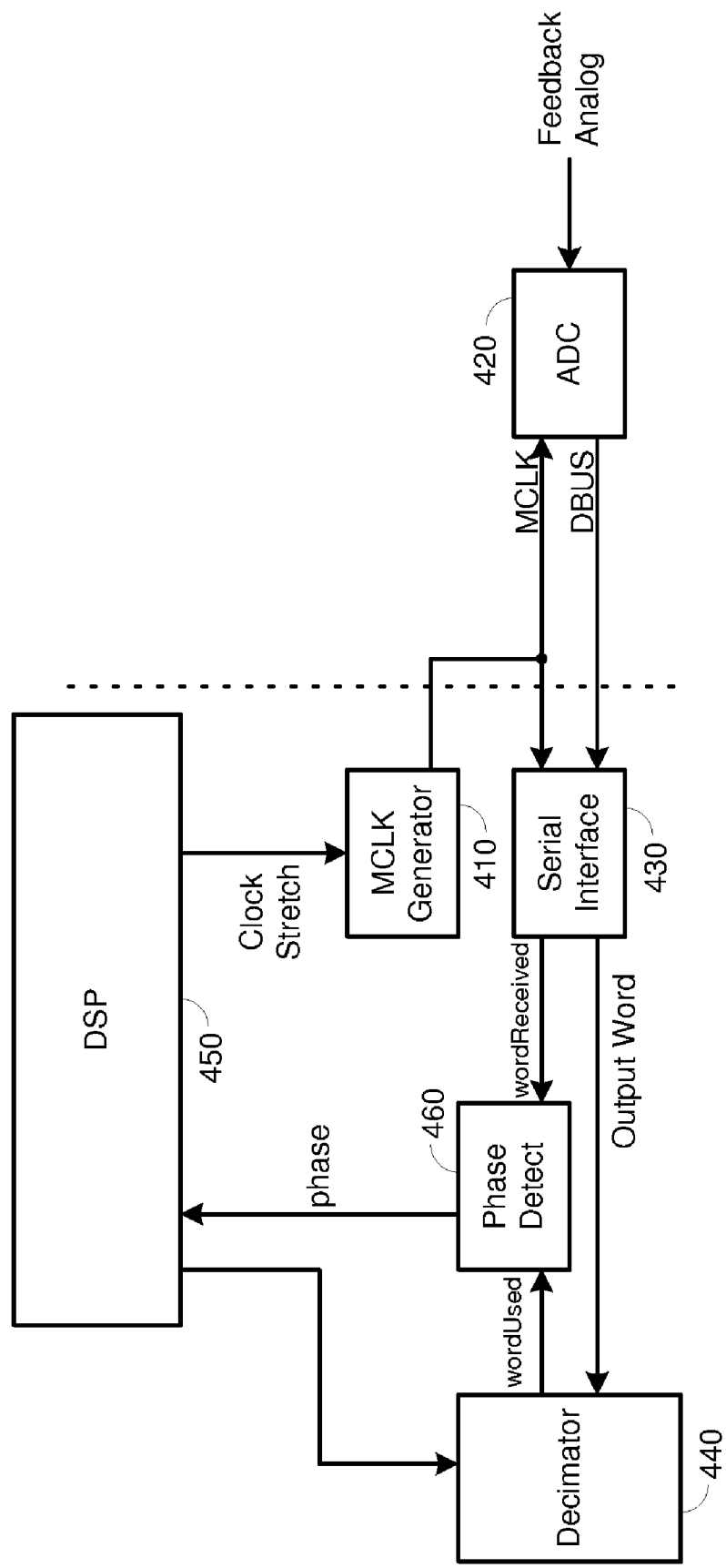
FIG. 4 is a functional block diagram illustrating the signal flow from an ADC to a decimator including an embodiment of the invention.

FIG. 4 contains a block diagram illustrating the preferred embodiment for the invention. This block contains elements described in FIG. 2, specifically the MCLK generator (410), ADC (420), serial interface (430), decimator (440), and DSP (450). A phaseDetect block (460) is present and receives the wordUsed signal from the decimator and the wordReceived signal from the serial interface. The phaseDetect block measures the time between a wordReceived signal and a wordUsed signal. This measurement is made available to the DSP as the phase signal. The MCLK generator block is modified to allow the period of individual MCLK to be stretched beyond the typical length to enable a phase-shift. The DSP, via the clockStretch signal, communicates to the MCLK generator to add time to one MCLK clock period to decrease the measured delay.

The phaseDetect block measures delay in units of the system clock (dclk), which typically has a rate of 150 MHz. A Verilog example of the measurement system is illustrated below.

```
integer count, phase;
always@(posedge dclk)
    if (wordReceived)
        count <= 0;
    else
        count <= count + 1;
```

```
always @(posedge dclk)
    if (wordUsed)
        phase <= count;
```

The MCLK generator block operates by dividing the system clock (dclk) down to the target frequency. This is implemented with a down counter. The phase stretching feature can be implemented by adding the clockStretch value to the down counter reload value as illustrated below. In this example, is assumed that clockStretch is zero when no stretch is intended and non-zero when stretch is intended.

```
integer count, reload; reg MCLK;
assign reload = divide + clockStretch
always @(posedge dclk)
    if (count == 0)
        count <= reload
    else
        count <= count - 1
always @(posedge dclk)
    if (count == 0)
        MCLK <= ~MCLK;
```

The phaseDetect and MCLK generator Verilog examples are meant to be illustrative. Additional verilog may be added to these examples to handle system implementation details such as handling reset, system start-up conditions, block enable signals, counter saturation, possible error conditions, and a more robust DSP interface. For example, the count variable in the phaseDetect may be limited to 10-bits and, if the counter value reaches 1023, it will not increment further and will signal the DSP that an error has occurred. Another example is that the phaseDetect block can be made to signal the DSP that an error has occurred if two consecutive wordUsed or wordReceived signals occur without an opposing signal following, as it is not a typical operating condition. Another example is that clock stretching implemented in the MCLK generator can be made to stretch only when the clock is low, only when the clock is high, or stretch on a user selectable clock phase.

PhaseDetect block 460, DSP 450 and MCLK generator 410 form what may be considered a delay minimization subsystem. This subsystem is configured to minimize the delay in the feedback path by minimizing the delay between the generation of a parallel data word by the serial interface and use of the word by the processing unit in the feedback path (the decimator in the embodiment of FIG. 4.) It should be noted that the delay minimization subsystem may be configured in a variety of ways, and that the configuration of FIG. 4 is intended to be illustrative of the possible embodiments.

Figure 5:
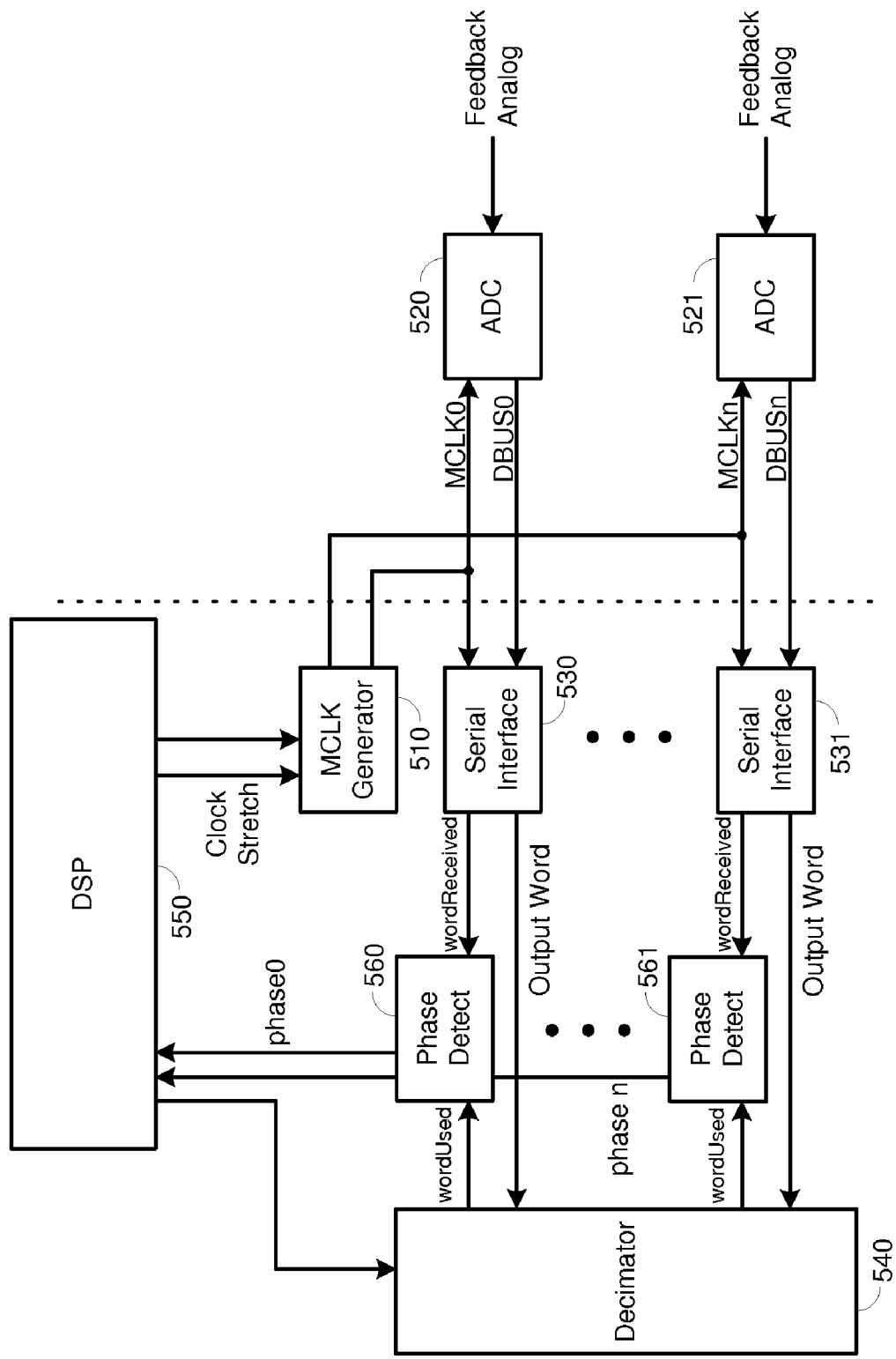
FIG. 5 is a functional block diagram illustrating the use of multiple signal paths from an ADC to a decimator in a digital PWM amplification system utilizing feedback.

The amplifier system may also contain multiple ADC to decimator paths as illustrated in FIG. 5. FIG. 5 is a block diagram illustrating an alternative embodiment in which there are multiple channels for feedback. FIG. 5 depicts elements including an MCLK generator (510), multiple ADCs (e.g., 520, 521), multiple serial interfaces (e.g., 530, 531), multiple phaseDetect blocks (e.g., 560, 561), a decimator (540), and a DSP (550).

Each feedback channel includes one of the ADCs, a corresponding one of the serial interfaces, and a corresponding one of the phaseDetect blocks. In this embodiment, the serial interface of each channel provides its output to a single processing unit (decimator 540.) The ADC and serial interface of each channel are supplied with an MCLK signal from the MCLK generator. Because the start-up phase of each individual ADC is unknown, the data received by the serial interfaces of the different channels may be received out of phase, causing the serial interfaces to generate their respective parallel data words at different times. Consequently, the delay in each feedback channel between the generation of a parallel data word and the use of the word by the decimator may be different from that of other channels. Each of the feedback channels therefore has its own phaseDetect block, which supplies corresponding delay information to the DSP. The DSP provides control information to the MCLK generator, which provides separate MCLK signals to each of the feedback channels. (in alternative embodiments, separate MCLK generators could be implemented for each feedback channel.) The separate MLCK signals are stretched according to the needs of the corresponding feedback channel to minimize the delay in each of the respective channels.

Figure 6:
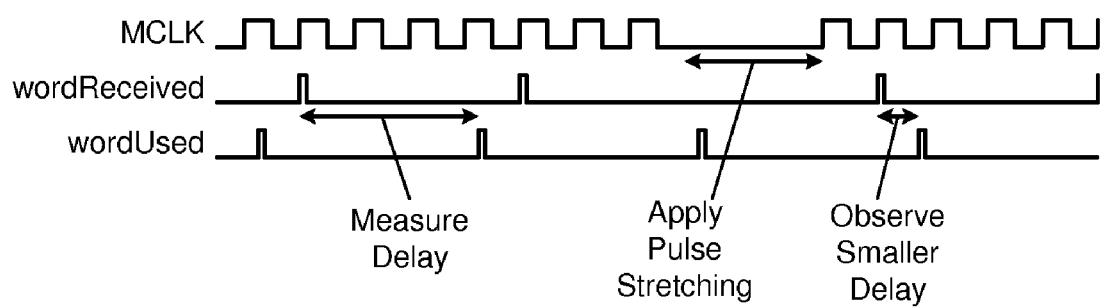
FIG. 6 is a timing diagram illustrating the embodied invention's use in correcting delay in serial communication While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

FIG. 6 contains a timing diagram illustrating a proper use of the embodied invention. The MCLK, wordReceived, and wordUsed signals refer to the signals in FIG. 4 (or to the signals for a single feedback channel of FIG. 5.) This figure assumes that it takes 4 MCLK cycles to transmit a delta-sigma word from the ADC. As previously illustrated in FIG. 4, a large time delay between the wordReceived signaling and the wordUsed signaling is shown. This delay is measured by the phaseDetect block. Subsequently, the DSP instructs the MCLK generator to apply the necessary pulse stretching to minimize the delay from wordReceived to wordUsed. Following the stretching, the next delay measured by the phaseDetect block should be significantly reduced.

While minimizing the transport delay according to the embodied invention, care must be taken to avoid introducing unwanted audio artifacts into real system implementations. Stretching an MCLK pulse may have a transient, undesirable effect on the external ADC in addition to the distortion resulting from the time shift. The delay minimization should be performed with the feedback loop open to ensure transient events are not audible. It is preferred to perform the delay minimization system at startup before audio starts playing through the amplifier system.

The target minimum delay must also be carefully considered. In a fully-functioning system, a certain amount of variation will be present in the phase measurement produced by the phaseDetect due to clock and signaling jitter. If zero delay is targeted and jitter results in the delta-sigma word being properly received after the wordUsed signal asserts on some fraction of the delta-sigma words, it will result in audible artifacts. It is preferred to target a measured delay of 2-3 DCLK cycles to provide adequate margin for clock and signal jitter.

It should be noted that the embodiments described above are intended to be illustrative. Alternative embodiments may implement one or more of the features described above using mechanisms or algorithms other than those described above. For example, while some embodiments may be implemented in PWM amplifiers, other embodiments may be implemented in other types of amplifiers, or other systems in which it is desirable to minimize feedback delays. Similarly, while the embodiments disclosed above use a DSP to monitor the delay between generation and consumption of data words in the feedback path and to control the stretching of the corresponding MCLK signal, alternative embodiments may use other components or configurations to implement the delay minimization subsystem.

Those of skill in the art will understand that information and signals may be represented using any of a variety of different technologies and techniques. For example, data, information, signals, bits, and the like that may be referenced throughout the above description may be represented by voltages, currents, electromagnetic waves, or the like, including combinations thereof. The information and signals may be communicated between components of the disclosed systems using any suitable transport media, including wires, metallic traces, and so on.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with application specific integrated circuits (ASICs), field programmable gate arrays (FPGAs), general purpose processors, digital signal processors (DSPs) or other logic devices, discrete gates or transistor logic, discrete hardware components, or any combination thereof designed to perform the functions described herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. An analog-to-digital feedback path comprising:
   a first analog-to-digital converter (ADC) configured to receive and digitize an analog signal to produce a serial digital output
   a first serial interface configured to receive and parallelize the serial digital output to produce a parallel data words
   a first processing unit configured to receive and perform data processing on the parallel data words to produce a digital feedback signal
   a first delay minimization subsystem configured to monitor a first delay between generation of parallel data words by the first serial interface and consumption of the parallel data words by the first processing unit, and to minimize the first delay.

2. The feedback path of claim 1, wherein the first delay minimization subsystem comprises:
   a delay measurement unit configured to monitor the first delay; and
   a clock generator configured to generate a clock signal which is provided to the first ADC and the first serial interface, wherein the clock generator is configured to adjust the clock signal to minimize the first delay.

3. The feedback path of claim 2, wherein the clock generator is configured to adjust the clock signal by stretching one or more periods of the clock signal.

4. The feedback path of claim 3, wherein the clock generator is configured to adjust the clock signal by stretching exactly one period of the clock signal.

5. The feedback path of claim 3, wherein the clock generator is selectable to stretch the one or more periods of the clock signal on either a high phase or a low phase.

6. The feedback path of claim 2, further comprising a digital signal processor (DSP) coupled to the delay measurement unit and the clock generator, wherein the DSP is configured to control the clock generator based on the first delay measured by the delay measurement unit.

7. The feedback path of claim 2, wherein the first processing unit comprises a decimator.

8. The feedback path of claim 1, wherein the feedback path comprises multiple feedback channels, wherein a first one of the feedback channels comprising the first ADC, the first serial interface, and the first delay minimization subsystem, and wherein each additional feedback channel comprises an additional ADC, an additional serial interface and an additional delay minimization subsystem.

9. The feedback path of claim 8, wherein the delay minimization subsystem of each feedback channel comprises a corresponding delay measurement unit configured to monitor a corresponding delay between generation of parallel data words by the corresponding serial interface and consumption of the parallel data words by the corresponding processing unit, and a corresponding clock generator configured to generate a clock signal which is provided to the corresponding ADC and the corresponding serial interface, wherein the clock generator is configured to adjust the clock signal to minimize the corresponding delay.

10. The feedback path of claim 9, wherein the clock generators are configured to adjust the corresponding clock signals independently of each other.

11. The feedback path of claim 1, wherein the feedback path is implemented in an amplifier which is configured to receive a digital audio signal and to generate an analog output signal based on the digital audio signal, wherein the analog feedback signal comprises the analog output signal, and wherein the digital audio signal is modified based on the digital feedback signal.

12. The feedback path of claim 11, wherein the amplifier comprises a pulse width modulation (PWM) amplifier which includes:
   a modulator configured to receive the digital audio signal and to produce a PWM signal based on the digital audio signal; and a power switch configured to receive the PWM signal and to produce the analog output signal based on the PWM signal.

13. A method for generating digital feedback from an analog signal comprising:
   digitizing an analog feedback signal to produce a serial digital output;
   converting the serial digital output into parallel data words;
   providing the parallel data words to a processing unit;
   the processing unit consuming the parallel data words and producing a digital feedback signal;
   monitoring a delay between generating the parallel data words and consuming the parallel data words; and
   minimizing the delay.

14. The method of claim 13, further comprising:
   generating a clock signal which is used in the digitizing of the analog feedback signal and the converting of the serial digital output into parallel data words; and
   adjusting the clock signal to minimize the delay.

15. The method of claim 14, wherein adjusting the clock signal comprises stretching one or more periods of the clock signal.

16. The method of claim 15, wherein adjusting the clock signal comprises stretching exactly one period of the clock signal.

17. The method of claim 15, wherein adjusting the clock signal comprises selectably stretching either a high phase of the clock signal or a low phase of the clock signal.

18. The method of claim 14, wherein the processing unit comprises a decimator, wherein the method further comprises the decimator decimating the parallel data words and producing a digital feedback signal.

19. The method of claim 13, wherein the method of claim 1 is performed in each of a plurality of feedback channels and the delay and clock signal of each feedback channel are independent of the other feedback channels, wherein the delay is separately measured in each of the feedback channels and the clock signal is separately adjusted in each of the feedback channels.

20. The method of claim 13, wherein the method is implemented in an amplifier which is configured to receive a digital audio signal and to generate an analog output signal based on the digital audio signal, wherein digitizing the analog feedback signal comprises digitizing the analog output signal, the method further comprising modifying the digital audio signal based on the digital feedback signal.

* * * * *